United States Patent
Miyazaki

(10) Patent No.: US 10,185,876 B2
(45) Date of Patent: Jan. 22, 2019

(54) DETECTION APPARATUS, DETECTION METHOD, AND LITHOGRAPHY APPARATUS

(71) Applicant: CANON KABUSHIKI KAISHA, Tokyo (JP)

(72) Inventor: Tadaki Miyazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/597,983

(22) Filed: Jan. 15, 2015

(65) Prior Publication Data

US 2015/0206298 A1    Jul. 23, 2015

(30) Foreign Application Priority Data

Jan. 20, 2014   (JP) .................................. 2014-008064

(51) Int. Cl.
*G06T 7/00* (2017.01)
*B29C 59/00* (2006.01)
(Continued)

(52) U.S. Cl.
CPC ....... *G06K 9/00624* (2013.01); *G03F 9/7088* (2013.01); *G06K 9/2063* (2013.01);
(Continued)

(58) Field of Classification Search
CPC .... G03F 9/7088; G03F 9/7011; G03F 9/7092; G06K 9/00624; G06K 9/2063;
(Continued)

(56) References Cited

U.S. PATENT DOCUMENTS

| 4,599,000 A | * | 7/1986 | Yamada ................... G03F 9/70 356/400 |
| 4,634,876 A | * | 1/1987 | Ayata .................... G03F 9/7069 250/548 |

(Continued)

FOREIGN PATENT DOCUMENTS

| JP | 03-201454 A | 9/1991 |
| JP | 2004-111861 A | 4/2004 |

(Continued)

*Primary Examiner* — Robert J Grun
*Assistant Examiner* — Jerzi H Moreno Hernandez
(74) *Attorney, Agent, or Firm* — Canon U.S.A., Inc. IP Division

(57) ABSTRACT

A detection apparatus includes an image pickup unit and a processor which detects a position of a mark using a two-dimensional image of the mark. The processor generates a one-dimensional signal having a plurality of peaks by accumulating images included in a detection region, detects peaks in which differences between values of the peaks and a reference value are equal to or larger than a threshold value and peaks in which differences between values of the peaks and the reference value are smaller than the threshold value from among the plurality of generated peaks and obtains a failure region in the mark, resets the detection region such that the differences between the values of the detected peaks and the reference value become smaller than the threshold value, generates a one-dimensional signal by accumulating images included in the reset detection region, and detects a position of the mark.

10 Claims, 11 Drawing Sheets

(51) Int. Cl.
  *G06K 9/00* (2006.01)
  *G03F 9/00* (2006.01)
  *G06K 9/20* (2006.01)
  *G06K 9/32* (2006.01)
  *G06T 7/73* (2017.01)
  *B29L 7/00* (2006.01)

(52) U.S. Cl.
  CPC .............. *G06K 9/3216* (2013.01); *G06T 7/73* (2017.01); *B29L 2007/001* (2013.01); *G06K 2009/3225* (2013.01); *G06T 2207/10056* (2013.01); *G06T 2207/30148* (2013.01); *G06T 2207/30208* (2013.01)

(58) Field of Classification Search
  CPC .......... G06K 9/3216; G06K 2009/3225; G06T 7/0042; G06T 2207/10056; G06T 2207/30208; G06T 2207/30148
  See application file for complete search history.

(56) References Cited

U.S. PATENT DOCUMENTS

| | | | | |
|---|---|---|---|---|
| 4,688,088 A * | 8/1987 | Hamazaki | ............... | B23Q 15/22 348/94 |
| 5,400,145 A * | 3/1995 | Suita | ..................... | G03F 9/7088 250/348 |
| 5,493,403 A * | 2/1996 | Nishi | ..................... | G03F 9/70 356/401 |
| 5,754,299 A * | 5/1998 | Sugaya | ............... | G03F 7/70241 356/399 |
| 5,754,300 A * | 5/1998 | Magome | ................... | G03F 9/70 250/548 |
| 6,101,267 A * | 8/2000 | Shiraishi | .............. | G03F 9/7092 356/401 |
| 6,333,786 B1 * | 12/2001 | Uzawa | .................. | G03F 9/7003 250/548 |
| 2001/0042068 A1* | 11/2001 | Yoshida | ............... | G05B 19/401 |
| 2003/0072570 A1* | 4/2003 | Seo | ......................... | G03B 35/00 396/331 |
| 2003/0199131 A1* | 10/2003 | Fujimoto | .............. | G03F 9/7076 438/200 |
| 2004/0058540 A1* | 3/2004 | Matsumoto | .......... | G03F 9/7076 438/689 |
| 2004/0204901 A1* | 10/2004 | Hayashi | .............. | G03F 7/70691 702/150 |
| 2007/0002298 A1* | 1/2007 | Visser | .................. | G03F 9/7076 355/55 |
| 2007/0076197 A1* | 4/2007 | Koga | ..................... | G01N 21/94 356/237.3 |
| 2008/0063956 A1* | 3/2008 | Egashira | ............... | G03F 9/7092 430/30 |
| 2008/0144047 A1* | 6/2008 | Hayashi | .............. | G03F 9/7003 356/620 |
| 2009/0201514 A1* | 8/2009 | Sato | ....................... | G03F 9/7026 356/624 |
| 2009/0220872 A1* | 9/2009 | Oishi | .................... | G03F 9/7092 430/30 |

FOREIGN PATENT DOCUMENTS

| | | |
|---|---|---|
| JP | 2006-294854 A | 10/2006 |
| JP | 2008-066638 A | 3/2008 |
| JP | 2010-061201 A | 3/2010 |

* cited by examiner

DETECTION APPARATUS, DETECTION METHOD, AND LITHOGRAPHY APPARATUS

BACKGROUND OF THE INVENTION

Field of the Invention

One disclosed aspect of the embodiments relates to a detection apparatus and a detection method for detecting alignment marks formed on an object and a lithography apparatus.

Description of the Related Art

In recent years, high accuracy and high functionality of semiconductor exposure apparatuses have been developed as miniaturization and high integration of semiconductor circuit patterns of integrated circuits (ICs) and large-scale integrations (LSIs) are advanced. In particular, accuracy of alignment of an original, such as a mask or a reticle, and a substrate, such as a semiconductor wafer or a glass plate, is important since the accuracy affects performance of apparatuses. Therefore, a technique of aligning a pattern formed on an original and a shot region set on a substrate with each other in nanometer order has been demanded. Accordingly, a position of the original is required to be exactly obtained.

Alignment of an original relative to an original holding unit (a reticle stage) which holds the original is referred to as "reticle alignment". In general, the alignment of the original relative to the reticle stage is performed by detecting a reticle mark formed on the original and a reference mark formed on the reticle stage by a scope (a microscope).

Images of the reticle mark and the reference mark are captured by an image pickup element (such as a two-dimensional CCD sensor). The reticle mark and the reference mark enable measurement of positions thereof relative to each other in an alignment direction (a measurement direction). The images of the reticle mark and the reference mark captured by the image pickup element are normally two-dimensional images. Accumulation is performed on each of the two-dimensional images of the reticle mark and the reference mark in a direction orthogonal to the measurement direction (a non-measurement direction) so that a one-dimensional image signal (image data) is generated. As described above, to detect a mark, a method using one-dimensional image data obtained by performing accumulation on a two-dimensional image in the non-measurement direction may be employed (refer to Japanese Patent Laid-Open No. 2004-111861).

However, in a case where dust (foreign particles) adheres on the reticle mark or the reference mark or in a case where a defective portion is included in the reticle mark or the reference mark, when accumulation is performed on each of the two-dimensional images of the marks in the non-measurement direction, a one-dimensional image signal obtained by the accumulation is changed (distorted) due to a factor not associated with the marks. Therefore, accuracy of detection of the marks may be degraded, which affects accuracy of the alignment.

SUMMARY OF THE INVENTION

One disclosed aspect of the embodiments provides a detection apparatus which detects a mark including a plurality of mark elements. The detection apparatus includes an image pickup unit configured to capture an image of the mark, and a processor which detects a position of the mark using a two-dimensional image of the mark obtained by the image pickup unit. The processor generates a one-dimensional signal having a plurality of peaks by accumulating images included in a detection region set in the two-dimensional image, detects peaks in which differences between values of the peaks and a reference value are equal to or larger than a threshold value and peaks in which differences between values of the peaks and the reference value are smaller than the threshold value from among the plurality of peaks of the generated signal and obtains a failure region in the mark using results of the detection, and resetting the detection region set in the two-dimensional image such that the differences between the values of the detected peaks and the reference value become smaller than the threshold value taking the obtained failure region into consideration and generating a one-dimensional signal having a plurality of peaks by accumulating images included in the reset detection region, and detects a position of the mark in accordance with the signal.

An aspect of the embodiments further provides a method for detecting a position of a mark including a plurality of mark elements. The method includes capturing an image of the mark, generating a one-dimensional signal having a plurality of peaks by accumulating images included in a detection region set in the captured two-dimensional image of the mark, detecting peaks in which differences between values of the peaks and a reference value are equal to or larger than a threshold value and peaks in which differences between values of the peaks and the reference value are smaller than the threshold value from among the plurality of peaks of the generated signal, obtaining a failure region in the mark using results of the detection, resetting the detection region set in the two-dimensional image such that the differences between the values of the detected peaks and the reference value become smaller than the threshold value taking the obtained failure region into consideration, generating a one-dimensional signal having a plurality of peaks by accumulating images included in the reset detection region, and detecting a position of the mark in accordance with the signal.

An aspect of the embodiments further provides a method for detecting a position of a mark including a plurality of mark elements. The method includes capturing an image of the mark, obtaining a failure region of the mark, setting a detection region in the captured two-dimensional image of the mark such that the detection region does not include the failure region, generating a one-dimensional signal having a plurality of peaks by accumulating images included in the set detection region, and detecting a position of the mark in accordance with the signal.

An aspect of the embodiments further provides a detection method including capturing an image of a mark including a plurality of mark elements, setting a window in the mark image obtained by the capturing, generating a signal having a plurality of peaks by performing accumulation on the mark image included in the window in a predetermined direction, newly generating a signal having a plurality of peaks by newly setting, in the mark image, a window having a width in the predetermined direction which is reduced relative to the window, a window which is located in a position different from a position of the window in the predetermined direction, or a window which has a width in the predetermined direction reduced relative to the window and which is located in a position different from a position of the window in the predetermined direction, on the basis of differences between peaks of the plurality of peaks and performing accumulation on the mark image in the newlyset window in the predetermined direction, and detecting a position of the mark using the newly-generated signal having the plurality of peaks.

Further features of the disclosure will become apparent from the following description of exemplary embodiments with reference to the attached drawings.

DESCRIPTION OF THE EMBODIMENTS

An embodiment will be described in detail hereinafter with reference to the accompanying drawings.

Figure 1:
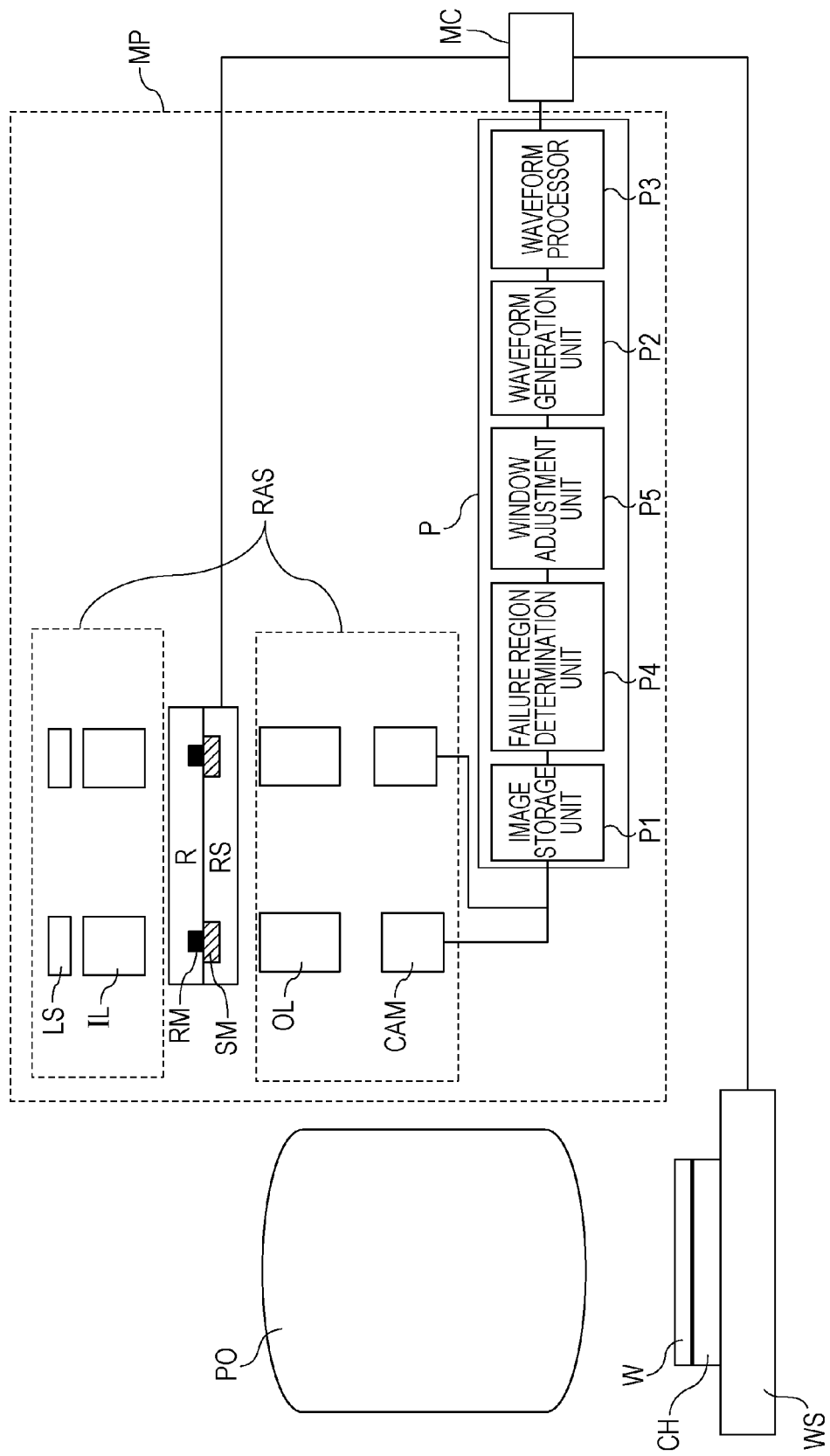
FIG. 1 is a diagram illustrating a detection apparatus and a portion of an exposure apparatus according to an embodiment.

A detection apparatus MP will now be described. FIG. 1 is a diagram illustrating a state in which the detection apparatus MP of this embodiment is applied to an exposure apparatus.

Method for Measuring Mark Positions

As a method for measuring positions of a mark, a method for detecting an alignment mark formed on a reticle R or a reticle stage RS by the detection apparatus MP and measuring a position of the alignment mark on the basis of a result of the detection will be described. Furthermore, a method for performing reticle alignment using a result of the measurement of the position of the alignment mark of the reticle stage RS or the reticle R will be described.

The reticle R has a reticle mark RM formed thereon, and the detection apparatus MP detects the reticle mark RM so as to obtain a position of the reticle R. The reticle R is conveyed to the reticle stage RS by a reticle conveying mechanism, not illustrated. The reticle stage RS has a reference mark SM formed thereon, and the detection apparatus MP detects the reference mark SM so as to obtain a position of the reticle stage RS.

A case where the reticle mark RM is formed on a lower surface of the reticle R (a surface of the reticle R which is in contact with the reticle stage RS) will be described in this embodiment. Furthermore, a case where the reference mark SM is formed on an upper surface of the reticle stage RS (a surface of the reticle stage RS which is in contact with the reticle R) will be described.

Figure 2:
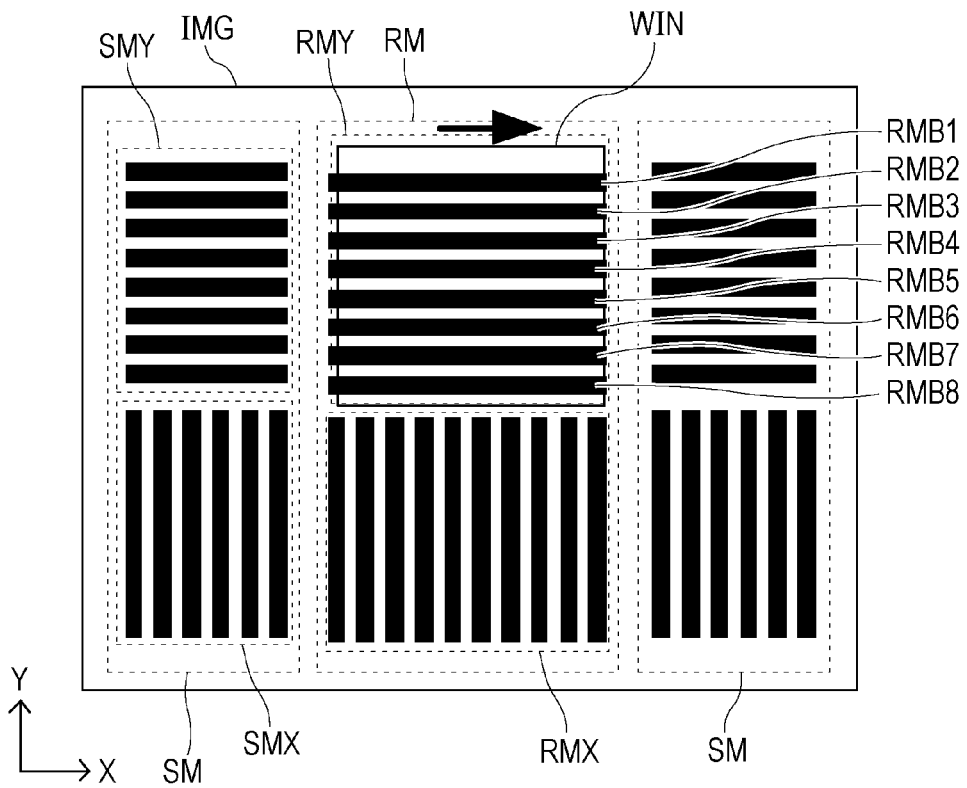
FIG. 2 is a diagram illustrating a reticle mark and a reference mark.

As illustrated in FIG. 2, the reticle mark RM has an X mark RMX used to measure a position in an X direction and a Y mark RMY used to measure a position in a Y direction which is orthogonal to the X direction, and the reference mark SM has an X mark SMX used to measure a position in the X direction and a Y mark SMY used to measure a position in the Y direction. Here, each of the X marks and the Y marks has a plurality of mark elements. For example, the Y mark of the reticle mark RM (the mark RMY) includes mark elements RMB1 to RMB8. The Y mark includes mark elements having a line shape extending in the X direction. By using the mark elements of the line shape, a position of the mark may be obtained by averaging results of detection of positions of the mark elements, and accordingly, accuracy of position measurement of the mark may be enhanced.

The reticle R is conveyed to the reticle stage RS such that the reticle mark RM and the reference mark SM overlap with each other as illustrated in FIG. 2. The detection apparatus MP detects the reticle mark RM and the reference mark SM so as to measure positions of the reticle R and the reticle stage RS relative to each other.

The detection apparatus MP includes a reticle alignment scope RAS and an image processing unit P. The reticle alignment scope RAS includes a light source LS, an illumination optical system IL, an objective optical system OL, and a camera CAM (image pickup unit) used to capture images of the reticle mark RM and the reference mark SM. The image processing unit P processes an image of the marks captured by the camera CAM so as to calculate positions of the reticle R and the reticle stage RS relative to each other.

Figure 3:
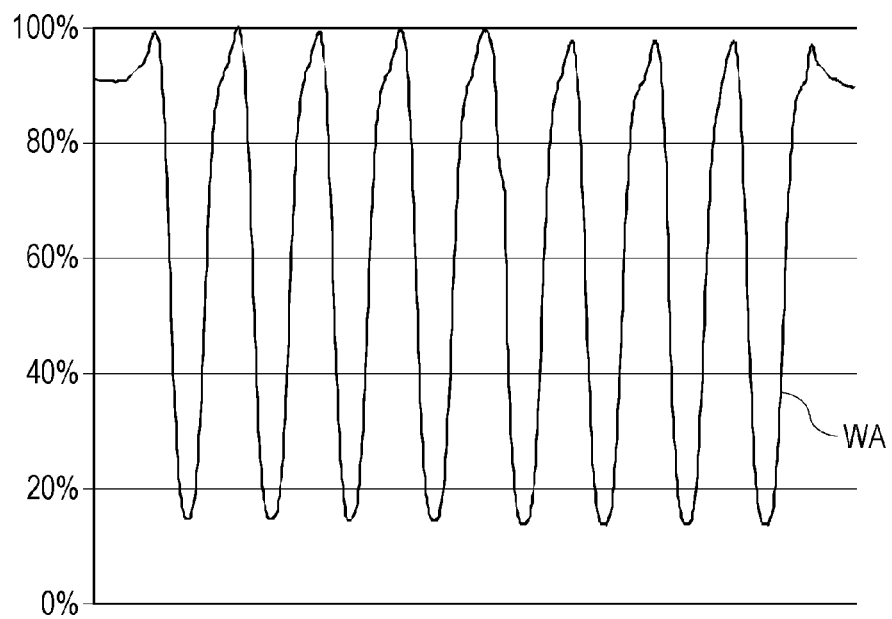
FIG. 3 is a diagram illustrating a signal obtained by accumulating images of a mark included in a detection region.

Specifically, the reticle alignment scope RAS captures a two-dimensional mark image IMG including a reticle mark RM and a reference mark SM to be stored in an image storage unit P1 included in the image processing unit P. In the stored mark image IMG, a waveform generation unit P2 included in the image processing unit P accumulates images in a region of a measurement window WIN (a detection region) which is set to the two-dimensional image and which corresponds to regions in which the marks are formed in a direction orthogonal to a position measurement direction. A one-dimensional signal (hereinafter referred to as an "accumulation waveform WA" is generated as illustrated in FIG. 3 by accumulating the images (signals corresponding to light quantities) in the direction orthogonal to the position measurement direction. Here, signals (light quantities) of the mark RMY included in a region of the measurement window WIN illustrated in FIG. 2 are accumulated in the X direction, that is, a predetermined direction. In FIG. 3, an axis of abscissa denotes a position in a non-accumulation direction (the Y direction) of the measurement window WIN and an axis of ordinate denotes a result of accumulation of light quantities in an accumulation direction (the X direction), that is, the predetermined direction, of the measurement window WIN. FIG. 3 is a graph illustrating relative light quantities obtained when a maximum light quantity value is 100%. In this example, light quantities in the positions of the mark (positions of the mark elements) are small whereas light quantities in positions in which the mark is not located (positions in which the mark elements are not located) are large. It is recognized that nine light quantity peaks are detected relative to the eight mark elements. In a normal state in which dust and a defect is not detected, light quantity values of the mark elements are substantially uniform.

A generated accumulation waveform WA is processed by a waveform processor P3 (a signal processor) included in the image processing unit P. The waveform processor P3 measures a position (in the Y direction) of the mark RMY of the reticle mark RM in the mark image IMG using the accumulation waveform WA. As a method for measuring the position by the waveform processor P3, a center of gravity of the accumulation waveform WA is calculated and processed so that the positions of the mark elements included in the mark are calculated, the positions of the mark elements are added to one another, and a resultant value is subjected to averaging so that a center position of the mark is calculated.

Similarly, the measurement window WIN is set to the mark RMX of the reticle mark RM and images in the measurement window WIN in the captured two-dimensional image are accumulated in the non-measurement direction (the Y direction) so that the one-dimensional accumulation waveform WA is generated. A position of the mark RMX of the reticle mark RM (in the X direction) in the mark image IMG is measured by processing the generated accumulation waveform WA. Furthermore, the same process is performed by the image processing unit P on the marks SMX and SMY of the reference mark SM so as to measure a position (in the X direction) of the mark SMX of the reference mark SM and a position (in the Y direction) of the mark SMY of the reference mark SM.

Results of the measurement of the positions of the reticle mark RM and the reference mark SM performed by the image processing unit P are supplied to a controller MC. According to the measurement results of the positions of the marks, the positions of the reticle R and the reticle stage RS relative to each other and an amount of shift of the reticle R relative to the reticle stage RS are obtained. Therefore, when a projection optical system PO of the exposure apparatus intends to project a pattern of the reticle R on a substrate W, a position of the reticle stage RS is corrected so that alignment between the reticle R and the substrate W may be performed at high accuracy. Alternatively, a position of a substrate stage WS which moves a substrate chuck CH which holds the substrate W is corrected so that alignment between the reticle R and the substrate W may be performed at high accuracy.

Case where Failure Region is Included

Figure 4:
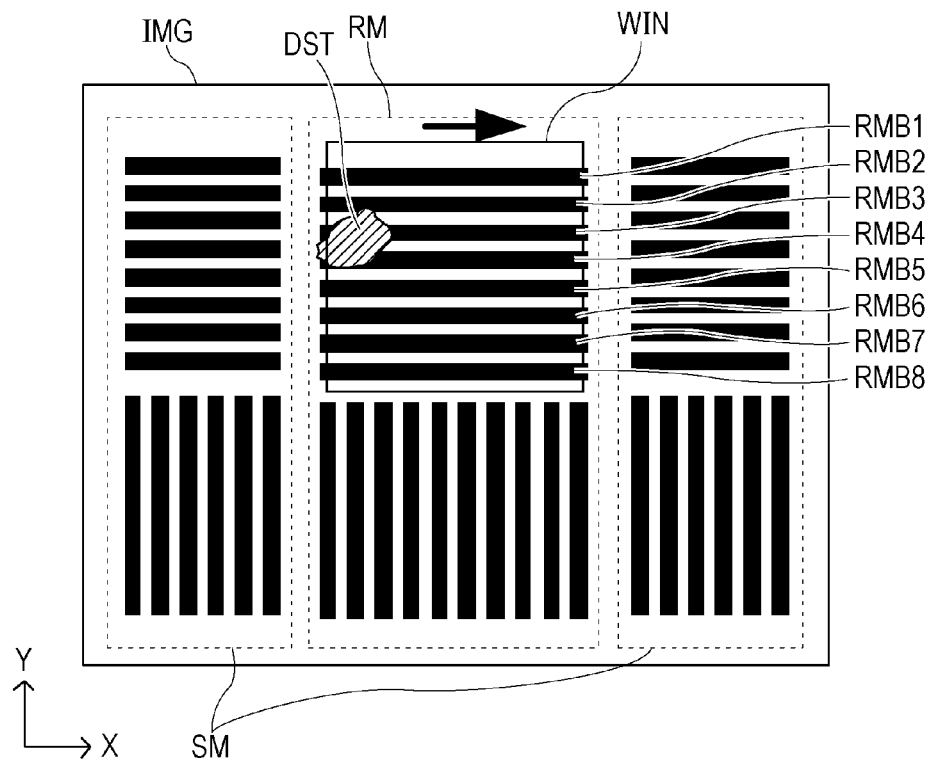
FIG. 4 is a diagram illustrating a mark including a failure region and the detection region.
Figure 5:
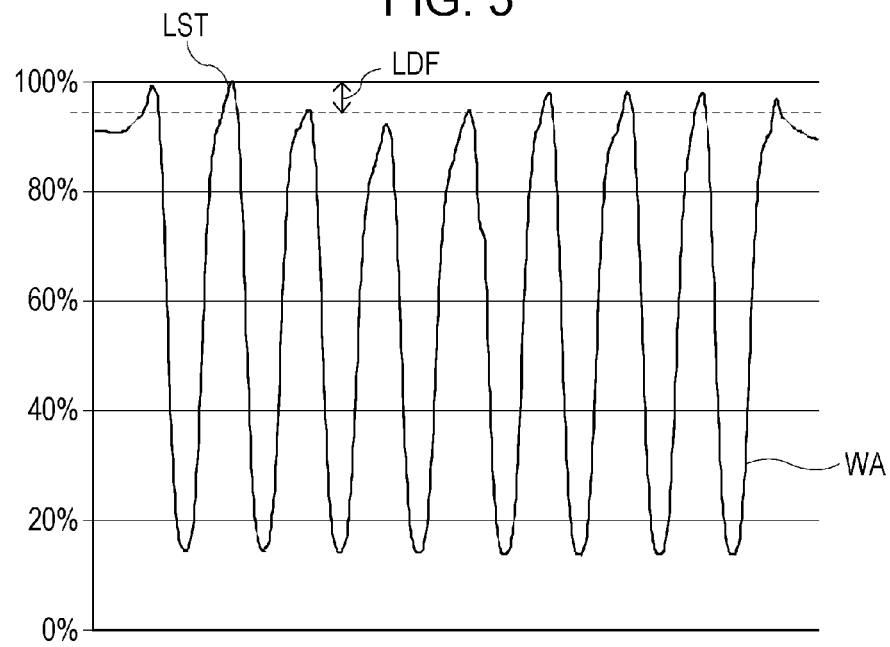
FIG. 5 is a diagram illustrating a signal obtained by accumulating images of the mark including the failure region.

When a failure region DST caused by dust which adheres to one of the marks or caused by a defect of one of the marks is included in the measurement window WIN as illustrated in FIG. 4, an accumulation waveform WA illustrated in FIG. 5 is obtained and light quantity values of the mark elements are not uniform. A light quantity value corresponding to the measurement window WIN including the failure region DST is small when compared with those of other regions, and a light quantity difference LDF is generated relative to the maximum light quantity value. If the position measurement described above is performed using the accumulation waveform WA of FIG. 5, accuracy of the measurement of the mark position may be lowered. Therefore, in an embodiment, the failure region DST is detected and the measurement window WIN is adjusted such that the region of the measurement window WIN is not affected by the failure region DST. An image of a mark in the adjusted measurement window WIN is captured and a position of the mark is measured using an accumulation signal obtained by performing accumulation on the two-dimensional image, so that accuracy of the measurement of the mark may be improved while an adverse effect of the failure region DST is reduced.

Figure 6:
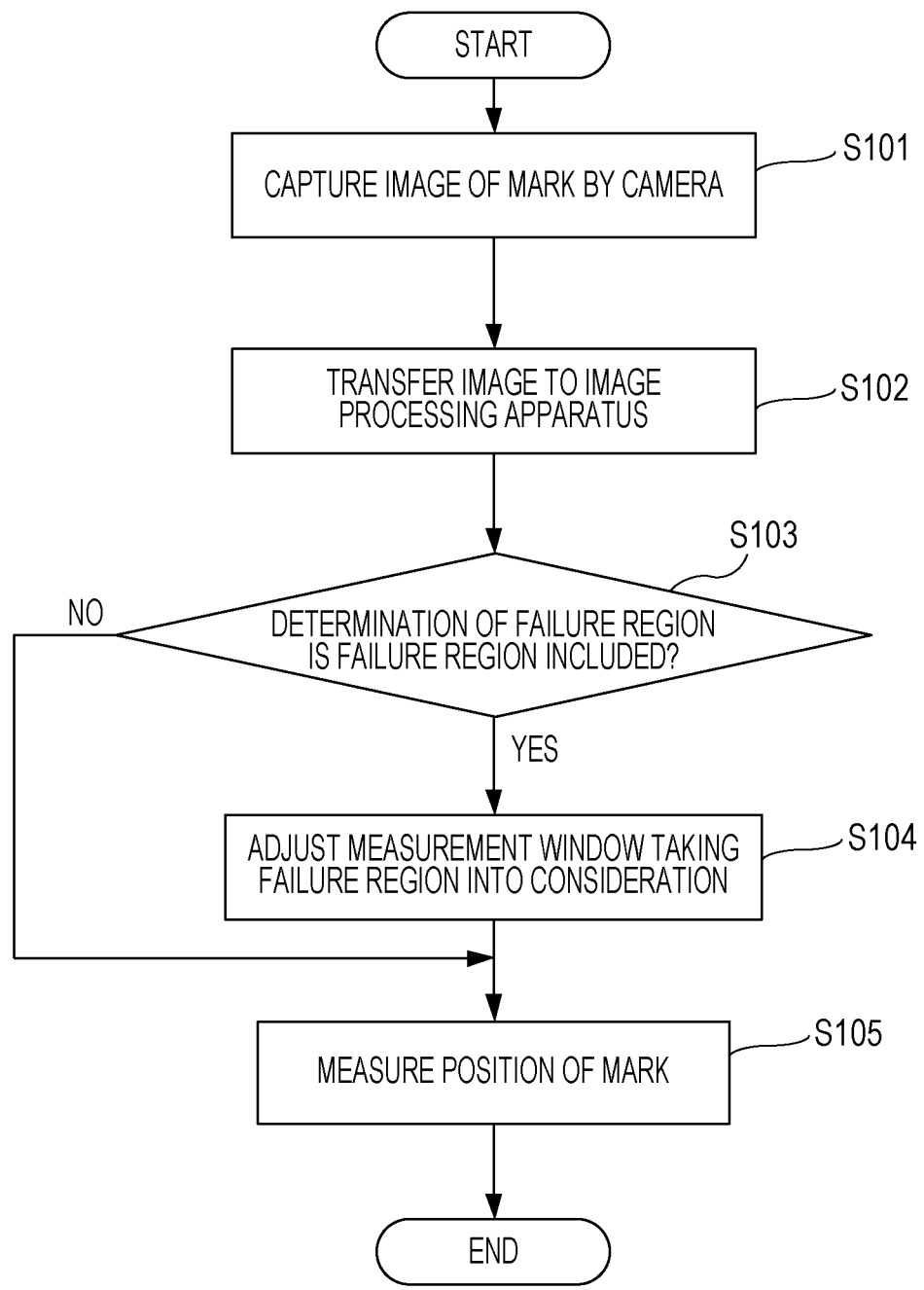
FIG. 6 is a flowchart illustrating a method for determining the failure region.
Figure 7:
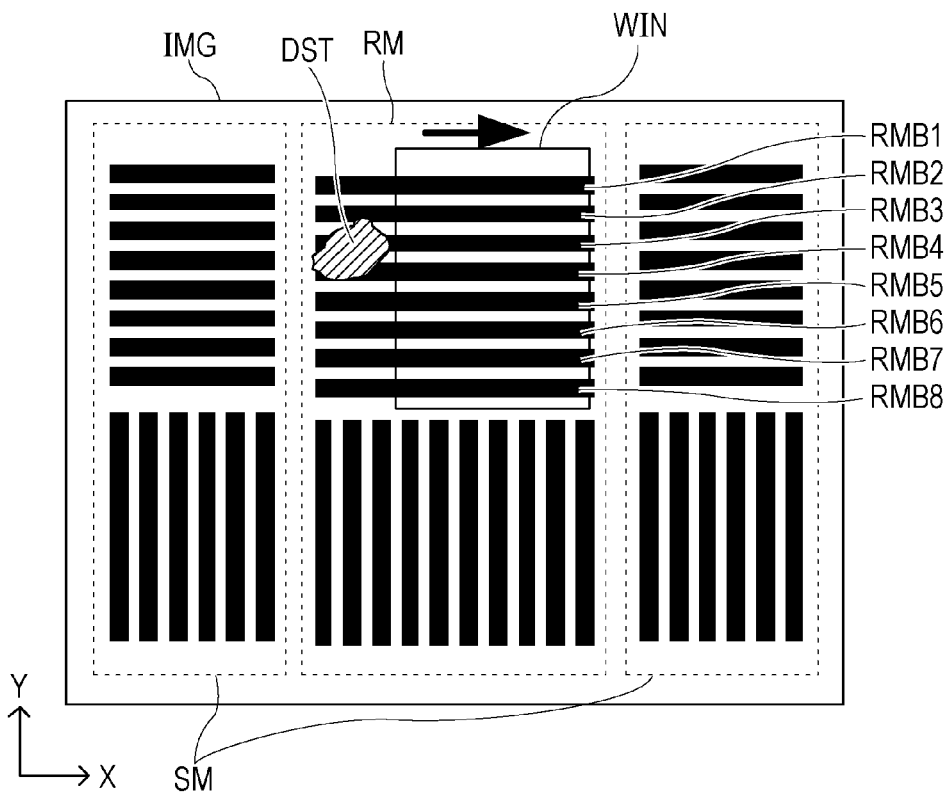
FIG. 7 is a diagram illustrating a state in which the detection region is set so as not to include the failure region.
Figure 8:
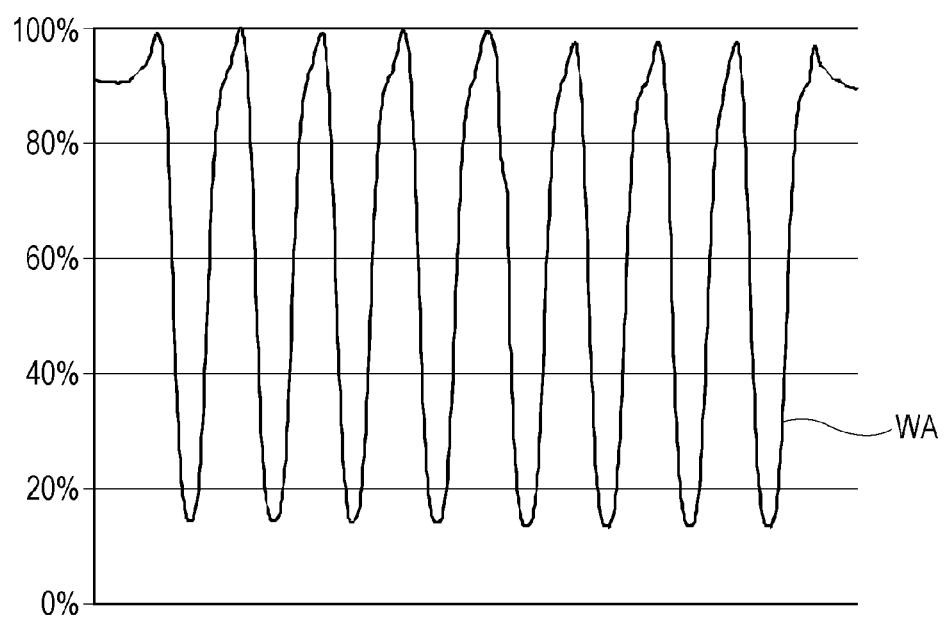
FIG. 8 is a diagram illustrating a signal obtained by accumulating images of the mark which does not include the failure region.

Therefore, the image processing unit P of the detection apparatus MP of this embodiment includes a failure region determination unit P4 and a window adjustment unit P5. After the mark image IMG captured by the reticle alignment scope RAS is stored in the image storage unit P1 of the image processing unit P, the failure region determination unit P4 determines whether the failure region DST including dust or a defect is included in regions of the reticle mark RM and the reference mark SM. When the failure region determination unit P4 determines that the failure region DST is included, the window adjustment unit P5 adjusts the region of the measurement window WIN so that an adverse effect of the failure region DST is avoided. Thereafter, an image of the mark in the measurement window WIN which is adjusted by the window adjustment unit P5 is captured and the obtained two-dimensional image is subjected to accumulation by the waveform generation unit P2 in a certain direction so that an accumulation waveform WA is generated. Method for Adjusting Light Quantity Peaks of Accumulation Light Quantity A method for measuring the positions of the reticle mark RM and the reference mark SM by the detection apparatus MP will be described with reference to a flowchart of FIG. 6, a mark image IMG of FIG. 7, and an accumulation waveform of FIG. 8. First, the camera CAM captures a mark image IMG in a state in which the reticle mark RM and the reference mark SM are included in an observation field of the reticle alignment scope RAS (S101). The captured mark image IMG is transferred from the camera CAM to the image processing unit P (S102). Next, the mark image IMG is processed so that it is determined whether the failure region DST is included in a mark in the region of the measurement window WIN (S103). As a result of the determination, when it is determined that the failure region DST is included, the measurement window WIN is adjusted so as not to include the failure region DST (S104). Then an accumulation waveform WA is generated using the adjusted measurement window WIN, and a position of the mark included in the measurement window WIN is measured (S105). As a result of the determination in step S103, when the failure region DST is not included, an accumulation waveform WA is generated using the preset measurement window WIN and a position of the mark included in the measurement window WIN is measured (S105). When the failure region DST is included, the region of the measurement window WIN is adjusted and reset such that the measurement window WIN does not include the failure region DST. When the accumulation waveform WA is generated using a two-dimensional image of the mark included in the adjusted and reset measurement window WIN, the accumulation waveform WA has substantially uniform light quantity values (light quantity peaks) in the measurement window WIN as illustrated in FIG. 8. Since the measurement window WIN is adjusted so as not to include the failure region DST, differences among peak values of a plurality of peaks obtained from the accumulation waveform WA of the measurement window WIN may be reduced, and accordingly, the position of the mark may be measured while a measurement error is reduced. As described above, when the reticle mark RM and the reference mark SM are detected, the positions of the reticle mark RM and the reference mark SM are measured using the accumulation waveforms WA generated by adjusting the measurement window WIN.

Method for Determining Failure Region

Figure 9:
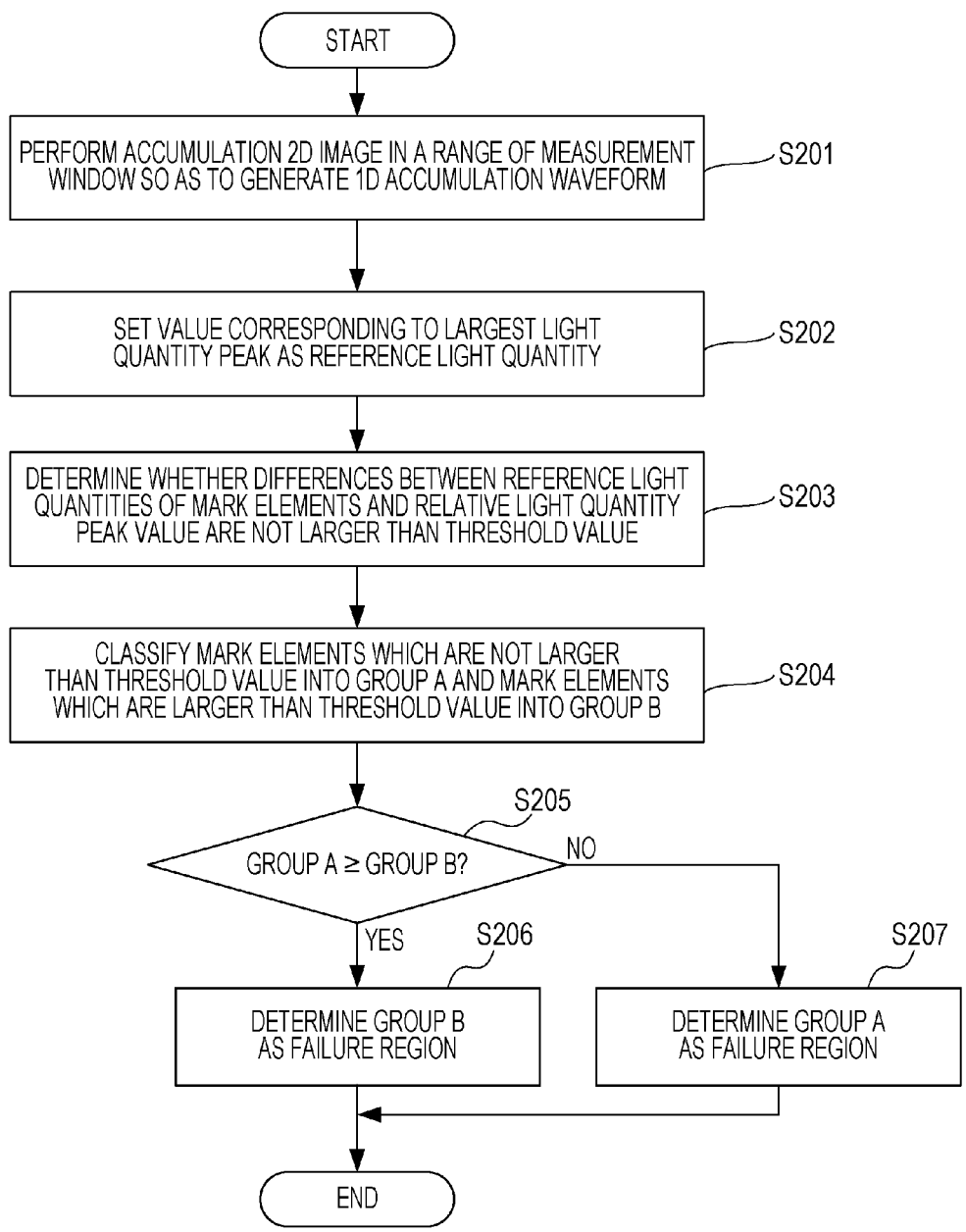
FIG. 9 is a flowchart illustrating a method for determining the failure region.

The method for determining the failure region DST in step S103 described above will be described with reference to the mark image IMG of FIG. 4, the accumulation waveform WA of FIG. 5, and a flowchart of FIG. 9. First, among marks included in an image captured by the camera CAM of the reticle alignment scope RAS, a two-dimensional image of a mark included in a range of the preset measurement window WIN are subjected to accumulation so that an accumulation waveform WA is generated (S201). In the accumulation waveform WA, among values of a plurality of peaks located in positions corresponding to spaces (gaps) between mark elements, the largest peak value is set as a reference value LST (S202). In FIG. 5, a peak which appears between the mark element RMB1 and the mark element RMB2 (a second light quantity peak from the left) has the largest value.

Subsequently, values of the other peaks (accumulation light quantity values) of the accumulation waveform WA are compared with the reference value LST (a reference light quantity value) and determines whether differences between the peak values and the reference value LST exceed a threshold value (S203). This determination is performed on the basis of differences between the peaks of the accumulation waveform WA and the reference light quantity value. In FIG. 5, nine peaks are illustrated in total, and the reference value LST is compared with values of the other eight light quantity peaks. Each of the peak values is compared with the reference value LST. Then at least one of the peaks in which a difference from the reference value LST does not exceed the threshold value is categorized into a group A whereas at least one of the peaks in which a difference from the reference value LST exceeds the threshold value is categorized into a group B (S204). Here, a peak having the same value as the reference value LST is categorized into the group A. After all the peaks included in the accumulation waveform WA are categorized into the group A or the group B, the number of peaks included in the group A and the number of peaks included in the group B are compared with each other (S205). As a result of the comparison, when the number of peaks included in the group A is larger than that of the group B, it is determined that a failure region is included in a region including the peaks of the group B (S206). On the other hand, as a result of the comparison, when the number of peaks included in the group B is larger than that of the group A, it is determined that a failure region is included in a region including the peaks of the group A (S207). Here, although the failure region is detected provided that the number of peaks including the failure region is small, the failure region may be detected provided that the number of peaks including the failure region is large.

Figure 10:
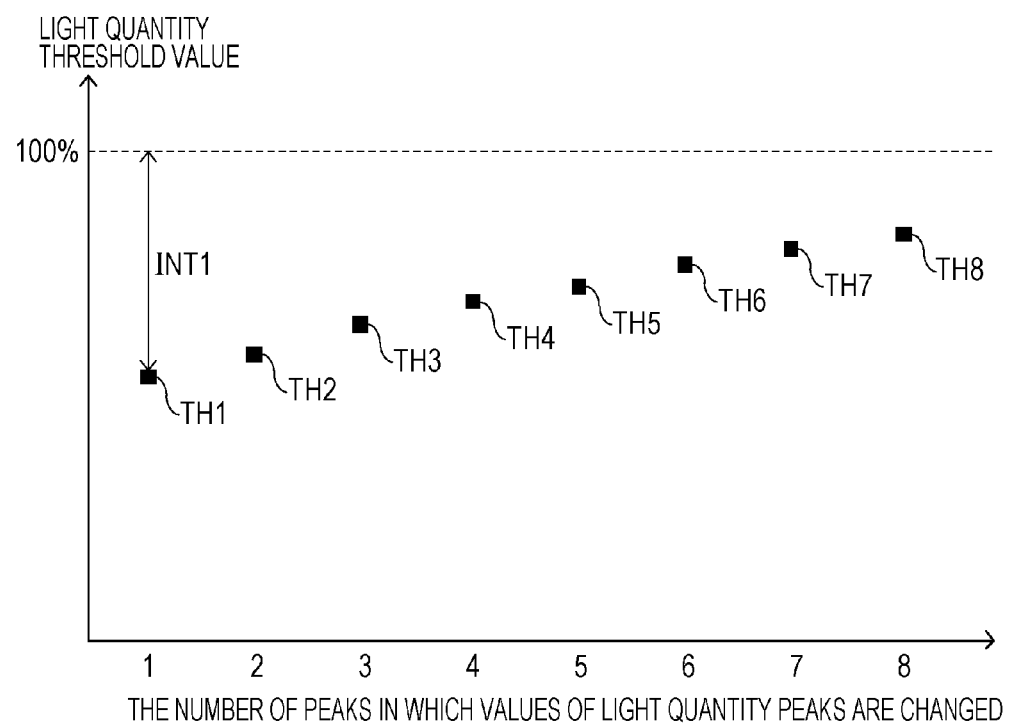
FIG. 10 is a graph illustrating threshold values used for a determination of the failure region relative to the numbers of mark elements in which light quantity peaks are changed.
Figure 11:
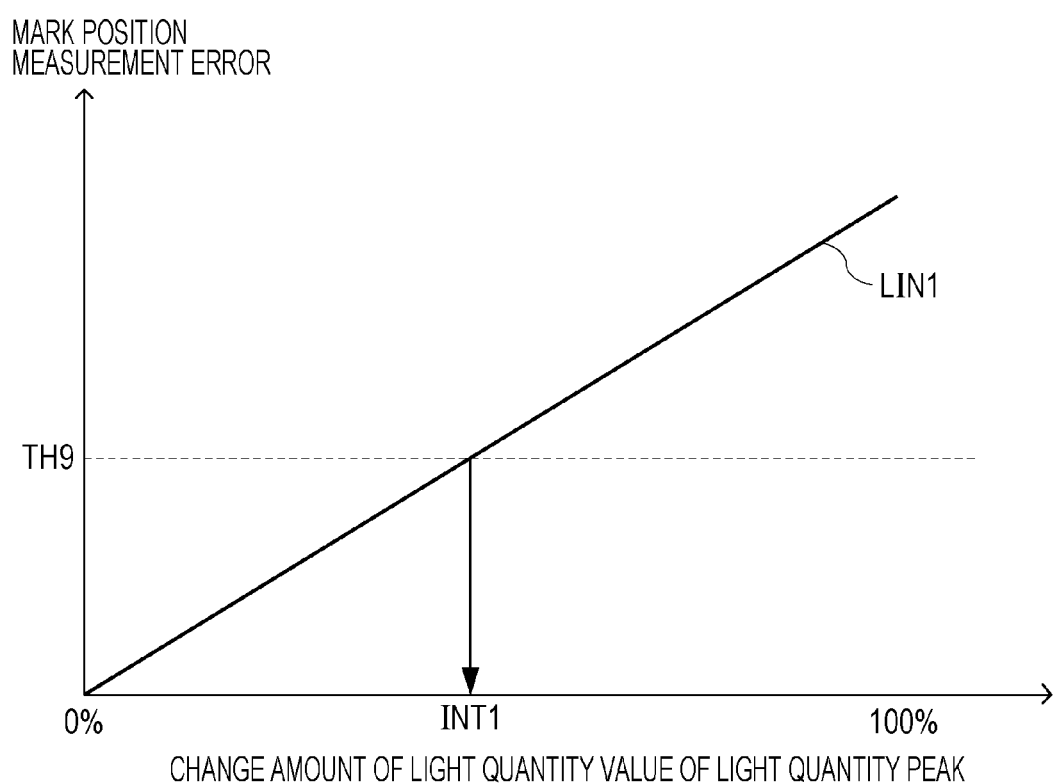
FIG. 11 is a graph illustrating the relationship between an amount of change of a light quantity value and a measurement error of a mark position.

The threshold value may be appropriately determined in accordance with a measurement error amount and accuracy obtained at a time when the position of the mark is measured. A method for obtaining the threshold value used for the determination of the failure region will be described with reference to FIGS. 1, 10, and 11. FIG. 10 is a diagram illustrating threshold values for light quantities corresponding to the numbers of peaks in which values of the peaks are changed when the peaks obtained from the accumulation waveform WA are compared with the reference value LST. Different threshold values may be set for the different numbers of peaks in which values of the peaks are changed as represented by TH1 to TH8 of FIG. 10. As the number of peaks in which values of the peaks are changed is small, a threshold value having a smaller ratio of a value of a peak to the reference value (a threshold value corresponding to a large change of a value of a peak relative to the reference value) is set. The different threshold values are set for different numbers of peaks in which the values of the peaks are changed since different measurement error amounts may be obtained when a position of a mark is measured depending on a range of the failure region including dust on a mark or a defect of a mark.

For example, in a case where the number of mark elements which are affected by the failure region is small, the number of mark elements having small measurement error amounts is large, and accordingly, an error amount of position measurement caused by the mark elements which are affected by the failure region is small. Accordingly, as the number of mark elements which are affected by the failure region is small, an acceptable amount of change of a value of a peak is large.

On the other hand, in a case where the number of mark elements which are affected by the failure region is large, the number of mark elements having large measurement error amounts is large, and accordingly, an error amount of position measurement caused by the mark elements which are affected by the failure region is large. Accordingly, as the number of mark elements which are affected by the failure region is large, an acceptable amount of change of a value of a peak is small. Alternatively, an arbitrary value may be set as the threshold value. In this case, although accuracy of the determination of the failure region is degraded, the determinations of values of peaks may be comparatively easily performed.

As described above, the threshold value which is compared with the values of the plurality of peaks may be obtained by measuring the relationships between change amounts of the values of the peaks and an error amount of the mark position measurement in advance. A case where the threshold value is obtained when a value of only one peak is changed will be described with reference to FIG. 11. First, when a measurement error amount of a mark position is obtained while a light quantity of the light source LS of the reticle alignment scope RAS is changed, a linear component LIN1 representing the relationship between an amount of change of the peak value and a measurement error of the mark position is obtained. Assuming that an acceptable mark position measurement error obtained taking accuracy required for the position measurement device into consideration is denoted by TH9, since the amount of the change of the peak value is represented by INT1 at this time, the threshold value TH1 for the amount of the change of the peak value is determined as INT1[%].

Method for Adjusting Measurement Window

Figure 12:
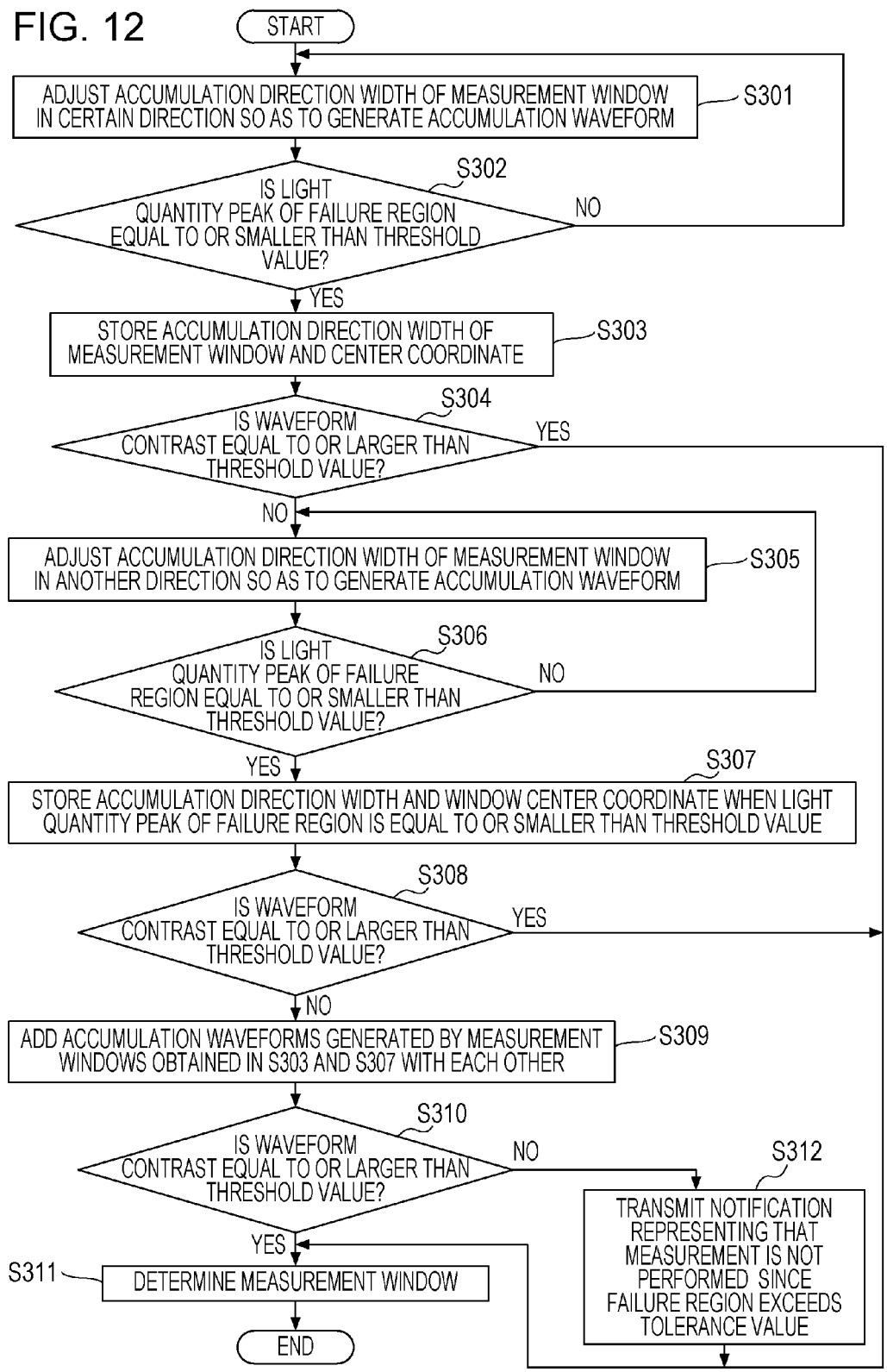
FIG. 12 is a flowchart illustrating a method for adjusting the detection region.

A method for adjusting the measurement window WIN will be described with reference to a flowchart of FIG. 12. The measurement window WIN is adjusted in a case where a failure region is included in a mark included in the measurement window WIN, such as a case where foreign particles adhere to the mark in the measurement window WIN or a case where a defect of the mark is detected. The region of the measurement window WIN is not adjusted when the values of the plurality of peaks obtained from the accumulation waveform WA are not changed.

As the method for adjusting the measurement window WIN, first, a width of the measurement window WIN is reduced by an arbitrary width in a certain direction (a first direction) along an accumulation direction which is a predetermined direction. Images (detection signals) obtained by capturing the mark in the narrowed measurement window WIN are accumulated so that an accumulation waveform WA is generated (S301). Thereafter, it is determined whether a difference between a value of a peak of the failure region and a value of a peak which is a reference value (a value of a peak of a region different from the failure region) is equal to or smaller than a threshold value (S302). When the difference between the values of the peaks is not equal to or smaller than the threshold value (that is, when the determination is negative), the process returns to step S301 where the measurement window WIN is further narrowed in the certain direction of the accumulation direction and an accumulation waveform WA of the measurement window WIN is obtained again. Then it is determined whether a difference between a value of a peak of the narrowed detection region and the reference value is equal to or smaller than the threshold value (S302). The measurement window WIN is repeatedly narrowed and an accumulation waveform WA is repeatedly generated until the difference between a value of a peak of a narrowed detection region and the reference value becomes equal to or smaller than the threshold value.

When the difference between the peak values becomes equal to or smaller than the threshold value, a width of the measurement window WIN (a first measurement window) in the accumulation direction and a center coordinate of the measurement window WIN at this time are stored (S303). Subsequently, detection signals in the measurement window WIN are accumulated in the accumulation direction so as to generate an accumulation waveform WA. Contrast of the generated accumulation waveform WA is obtained and it is determined whether the contrast is equal to or larger than a certain threshold value (S304). Since the measurement window WIN is narrowed so as not to include the failure region, values of peaks in the entire accumulation waveform WA are lowered, and therefore, the contrast is degraded. The degradation of the contrast may cause degradation of accuracy of position measurement, and therefore, the contrast of the accumulation waveform WA is checked. The threshold value for the contrast which does not degrade the accuracy of the position measurement may be obtained in advance. To suppress the degradation of the accuracy of the position measurement, instead of the contrast, a value of a peak of the detected accumulation waveform WA may be used as a criterion for a determination.

When the contrast is equal to or larger than the threshold value, the measurement window WIN at this time is determined as a detection region (S311). When the contrast is smaller than the threshold value, the region before the measurement window WIN is narrowed in step S301 is obtained again, and the measurement window WIN is narrowed by an arbitrary width in a direction (a second direction) opposite to the direction (the first direction) in which the measurement window WIN is narrowed in step S301. An image (detection signals) obtained by capturing the mark in the narrowed measurement window WIN are subjected to accumulation so that an accumulation waveform WA is generated (S305).

It is determined whether a difference between a value of a peak in the failure region and a value of a peak which is a reference value (a value of a peak of a region different from the failure region) is equal to or smaller than a threshold value (S306). When the difference between the values of the peaks is not equal to or smaller than the threshold value (that is, when the determination is negative), the process returns to step S305 where the measurement window WIN is further narrowed in the direction (the second direction) along the accumulation direction so that an accumulation waveform WA in the measurement window WIN is obtained again. Then it is determined whether a difference between a value of a peak of a further narrowed detection region and the reference value is equal to or smaller than the threshold value again from the accumulation waveform WA of the mark in the detection region (S306). The measurement window WIN is repeatedly narrowed and an accumulation waveform WA is repeatedly generated until the difference between a value of a peak of a narrowed detection region and the reference value becomes equal to or smaller than the threshold value.

When the difference between the peak values becomes equal to or smaller than the threshold value, a width in the accumulation direction of the measurement window WIN (a second measurement window) and a center coordinate of the measurement window WIN at this time are stored (S307). Subsequently, the image (the detection signals) obtained by capturing the mark in the measurement window WIN is subjected to accumulation in the accumulation direction so that an accumulation waveform WA is generated. Contrast of the generated accumulation waveform WA is obtained and it is determined whether the contrast is equal to or larger than the certain threshold value (S308).

When the contrast is equal to or larger than the threshold value, the measurement window WIN at this time is determined as a detection region (S311). When the contrast is smaller than the threshold value, the accumulation waveform WA of the first measurement window WIN obtained in step S303 and the accumulation waveform WA of the second measurement window WIN obtained in step S307 are added to each other (S309). It is determined whether contrast of an accumulation waveform WA obtained by adding the accumulation waveforms WA of the two measurement windows WIN to each other is equal to or larger than the threshold value (S310). When the contrast is equal to or larger than the threshold value, the first measurement window WIN obtained in step S303 and the second measurement window WIN obtained in step S307 are determined as detection regions for detection of a mark position (S311). When the contrast of the accumulation waveform WA obtained from the first measurement window WIN and the second measurement window WIN is smaller than the threshold value, the image processing unit P notifies the controller MC of a fact that measurement of a position of a mark after eliminating the failure region may not be performed (S312).

Other Methods for Adjusting Measurement Window

As another method for adjusting the measurement window WIN, a method which does not use mark elements in the failure region may be employed. When the mark illustrated in FIG. 2 is used, an accumulation waveform WA obtained by performing accumulation on an image obtained by capturing the mark in the measurement window WIN has nine peaks since the mark includes the eight mark elements, and therefore, a position of the mark is measured using values of the nine peaks. However, when the failure region DST illustrated in FIG. 4 is included in the mark, the accumulation waveform WA in the measurement window WIN illustrated in FIG. 5 is obtained. Therefore, the position of the mark may be measured using values of peaks which are equal to or larger than the threshold value without using light quantity peaks smaller than the threshold value (an accumulation waveform WA in the failure region). The measurement of the position of the mark is performed without using values of third to fifth peaks from the left among the nine peaks but using values of the other six peaks among the values of the nine peaks. In this case, although accuracy of measurement of the position of the mark is degraded since the number of peaks (the number of mark elements) used for the measurement is reduced, the measurement window WIN may be adjusted by a comparatively simple process.

Figure 13:
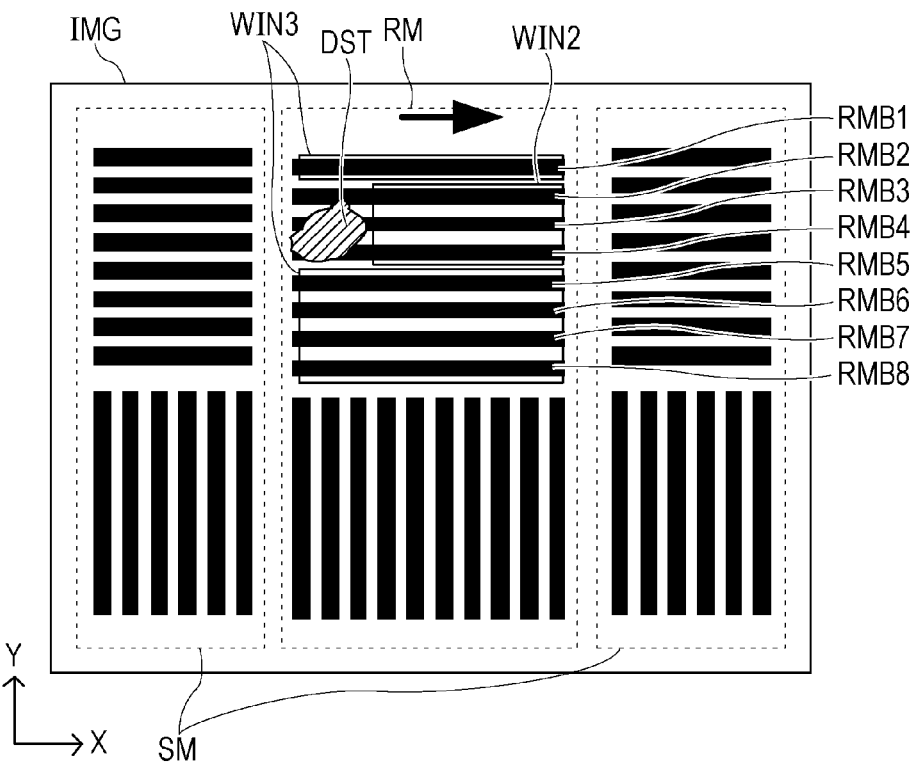
FIG. 13 is a diagram illustrating the method for adjusting the detection region.

Furthermore, as another method for adjusting the measurement window WIN, different settings of the measurement window WIN are applied to mark elements including the failure region DST and mark elements which do not include the failure region DST as illustrated in FIG. 13. For example, in a region including the mark elements RMB2, RMB3, and RMB4 which include the failure region DST, a measurement window WIN2 having a width adjusted by the adjustment method described above is used as a detection region. On the other hand, in a region including the mark element RMB1 and a region including the mark elements RMB5 to RMB8, measurement windows WIN3 having predetermined widths may be used as detection regions. Since the different measurement windows are used for the mark elements including the failure region DST and the mark elements which do not include the failure region DST, an accumulation waveform WA having higher contrast may be obtained in the region other than the failure region when the accumulation waveform WA is generated and measurement accuracy may be enhanced.

In the embodiment described above, an image of marks is captured by the camera CAM and an accumulation waveform WA to be processed is generated by performing accumulation on the captured two-dimensional image in the accumulation direction. However, the camera CAM or a sensor which captures the image of the marks is not limited to a camera using a two-dimensional CCD sensor. For example, a one-dimensional accumulation waveform may be obtained while scanning is performed in the accumulation direction by a light quantity sensor on a mark. A range of the scanning corresponds to the measurement window WIN of this embodiment.

As described above, according to the detection method of this embodiment, even when a failure region is included in a mark to be measured, accuracy of detection of the mark is improved by detecting the failure region and adjusting the measurement window WIN. It is expected that, using a result of the detection, a measurement error of a position of a mark is reduced and the position measurement is performed at higher accuracy.

Furthermore, as the method for adjusting the measurement window WIN, images of a mark obtained by capturing the mark included in the measurement window WIN may be accumulated in a direction orthogonal to the accumulation direction described above so that the failure region is specified. In a case of the failure region including dust, for example, when the images of the mark are accumulated in the direction orthogonal to the accumulation direction, a light quantity of the failure region is reduced. Accordingly, the failure region may be specified.

Figure 14:
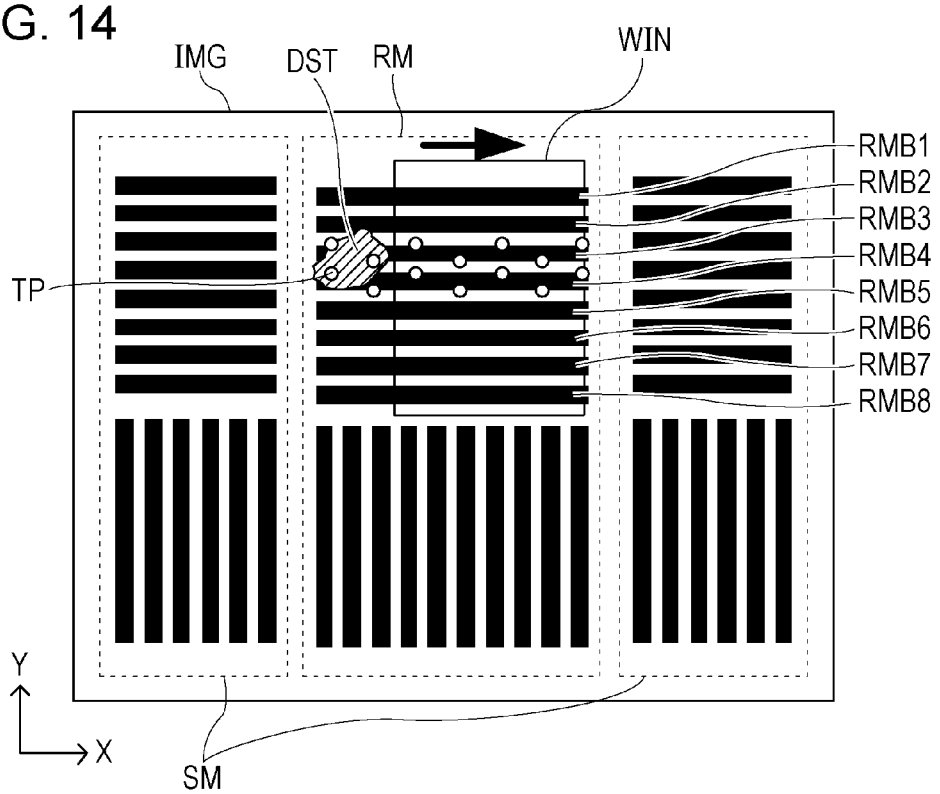
FIG. 14 is a diagram illustrating another method for adjusting the detection region.

Furthermore, as the method for adjusting the measurement window WIN, the failure region may be specified by template matching as illustrated in FIG. 14. The measurement window WIN is adjusted such that the failure region specified by the template matching is not included in the measurement window WIN. A degree of correlation between a mark to be measured and a template TP is obtained by the template matching. Since it is likely that the degree of correlation is lowered in the failure region DST, the measurement window WIN is determined by excepting a region having a low degree of correlation.

Exposure Apparatus

Figure 15:
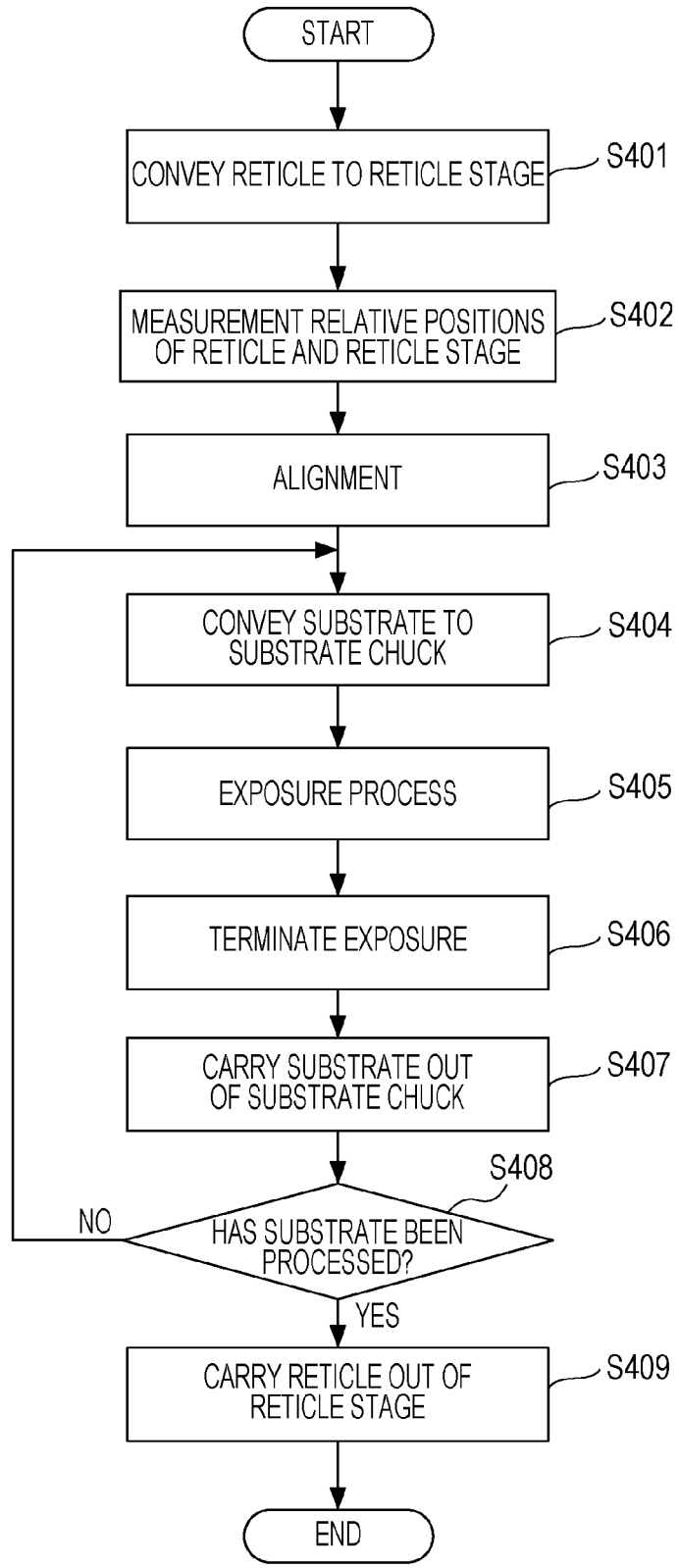
FIG. 15 is a flowchart illustrating an exposure method using the detection apparatus according to an embodiment.

An exposure apparatus including the detection apparatus according to an embodiment will be described. An exposure method employed in the exposure apparatus in which the projection optical system PO projects a pattern of the reticle R on the substrate W will be described with reference to a flowchart of FIG. 15.

The reticle R is conveyed to the reticle stage RS by the reticle conveying mechanism, not illustrated (S401). Subsequently, a position shift amount of the reticle R relative to the reticle stage RS is measured (S402). The relative position shift amount is measured by detecting the reticle marks RM and the reference marks SM by the detection method described above and performing image processing on results of the detection by the image processing unit P so as to measure positions of the reticle marks RM and the reference marks SM relative to each other. The position shift amount is obtained from the positions of the reticle marks RM and the reference marks SM relative to each other, and the reticle stage RS is driven so that the reticle R is aligned (S403).

After the alignment of the reticle R, the substrate W is conveyed on the substrate chuck CH disposed on the substrate stage WS by a substrate conveying mechanism, not illustrated (S404). When the substrate W is conveyed on the substrate chuck CH, alignment marks are detected using a scope (a substrate alignment scope), not illustrated, so that the substrate stage WS is aligned. The conveyance of the reticle R and the conveyance of the substrate W may be performed in parallel. After the substrate W is disposed on the substrate stage WS, the pattern of the reticle R is exposed on the substrate W (S405). The exposure process (pattern transfer) may be performed on an entire surface of the substrate W by repeatedly exposing the pattern of the reticle R on the substrate W (S406). After the pattern transfer performed on the entire surface of the substrate W is completed, the substrate W is carried out by the substrate conveying mechanism (S407). When a substrate to be processed exists, the process from step S404 to step S407 is performed again, whereas when a substrate to be processed does not exist, the process is terminated after the reticle R is carried out (S408 and S409). Note that the carrying-out of the reticle R and the carrying-out of the substrate W may be performed in parallel.

As the exposure apparatus described above, a stepper which successively transfers a pattern formed on an original (a reticle, for example) in a plurality of portions in a substrate (a wafer, for example) while moving the substrate in a stepping manner may be used. Alternatively, a scanner which transfers a pattern on a substrate while driving a substrate stage which holds a substrate and a reticle stage which holds a reticle relative to each other may be used as the exposure apparatus. The detection apparatus described above may be employed in not only the exposure apparatus but also other lithography apparatuses, such as an imprint apparatus. The imprint apparatus may form a pattern on an imprint member supplied on a substrate using a mold serving as an original. The reference marks SM may be formed on a mold holding unit which holds the mold and marks (mold marks) corresponding to the reticle marks RM described above may be formed on the mold so that a position of the mold relative to the mold holding unit is measured.

The case where the detection apparatus is applied to the exposure apparatus or the imprint apparatus has been described hereinabove. Since the reticle stage RS and the substrate stage WS are driven in accordance with positions of the reticle (the original) and the reticle stage (the original holding unit) which are relative to each other so that the alignment is performed, the reticle may be aligned relative to the wafer (the substrate) at high accuracy.

Although the preferred embodiment has been described hereinabove, the disclosure is not limited to the embodiment described above, and various modifications and alternations may be made within the scope of the disclosure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-008064, filed Jan. 20, 2014, which is hereby incorporated by reference herein in its entirety.

What is claimed is:

1. A detection apparatus which detects a position of a mark including a plurality of mark elements, the detection apparatus comprising:
   an image pickup unit configured to capture a two-dimensional image of the mark; and
   a processor which detects a position of the mark using the two-dimensional image of the mark obtained by the image pickup unit,
   wherein the processor
     sets a detection region in the two-dimensional image of the mark,
     generates a one-dimensional integrated signal having a plurality of peaks by accumulating, in a predetermined direction, a two-dimensional image signal included in the detection,
     detects peaks in which differences between values of the peaks and a reference value are equal to or larger than a threshold value and peaks in which differences between values of the peaks and the reference value are smaller than the threshold value from among the plurality of peaks of the generated integrated signal in order to determine if a failure region is present within the detection region, and
     in a case where a failure region is present within the detection region, the processor narrows a width of the detection region in the predetermined direction until the failure region is excluded so as to form a new detection region that does not include the failure region, generates a new one-dimensional integrated signal having a plurality of peaks by accumulating, in the predetermined direction, a two-dimensional image signal included in the new detection region, and detects a position of the mark based on the new one-dimensional integrated signal.

2. The detection apparatus according to claim 1, wherein the mark includes a plurality of lines each of which is parallel with each other serving as the mark elements, and
   the processor accumulates images included in the detection regions along the lines.

3. The detection apparatus according to claim 1, wherein the processor sets a largest value of a peak among the plurality of peaks as a reference value and compares the values of the plurality of peaks with the reference value so as to obtain differences between the values of the plurality of peaks and the reference value.

4. The detection apparatus according to claim 1, wherein the processor determines, when the number of peaks in which differences between values of the peaks and the reference value are equal to or larger than the threshold value is smaller than the number of peaks in which differences between values of the peaks and the reference values are smaller than the threshold value, that a failure region of the mark is included in positions of the peaks in which the differences between the values of the peaks and the reference value are equal to or larger than the threshold value, and resets the detection region to the two-dimensional image taking the failure region into consideration.

5. The detection apparatus according to claim 1, wherein the processor determines, when the number of peaks in which differences between values of the peaks and the reference value are equal to or larger than the threshold value is larger than the number of peaks in which differences between values of the peaks and the reference values are smaller than the threshold value, that a failure region of the mark is included in positions of the peaks in which the differences between the values of the peaks and the reference value are smaller than the threshold value, and resets the detection region to the two-dimensional image taking the failure region into consideration.

6. The detection apparatus according to claim 1, wherein the threshold value is obtained on the basis of the number of peaks in which differences between values of the peaks and the reference value are generated.

7. The detection apparatus according to claim 1, wherein the new detection region comprises at least a firs window and a second window, wherein each window has mark elements and excludes the failure region, and wherein the first window has a width that is narrower than a width of the second window with respect to the predetermined direction.

8. The detection apparatus according to claim 1, wherein the detection region comprises a plurality of windows including the plurality of the mark elements, wherein the widths of the windows are narrowed with respect to the predetermined direction such that the failure region is removed from the windows.

9. A method for detecting a position of a mark including a plurality of mark elements, the method comprising:
   capturing a two-dimensional image of the mark;
   setting a detection region in the two-dimensional image of the mark;
   generating a one-dimensional signal having a plurality of peaks by accumulating, in a predetermined direction, a two-dimensional image signal included in a detection region;
   detecting peaks in which differences between values of the peaks and a reference value are equal to or larger than a threshold value and peaks in which differences between values of the peaks and the reference value are smaller than the threshold value from among the plurality of peaks of the generated signal in order to determine if a failure region is present within the detection region;
   in a case where a failure region is present within the detection region,
   narrowing the width of the detection region in the predetermined direction until the failure region is excluded so as to form a new detection region that does not include the failure region, and
   generating a new one-dimensional integrated signal having a plurality of peaks by accumulating, in the predetermined direction, a two-dimensional image signal included in the new detection region; and
   detecting a position of the mark based on the new one-dimensional integrated signal.

10. A lithography apparatus which forms a pattern on a substrate using an original, the lithography apparatus comprising:
- an original holding unit configured to hold the original; and
- a detection apparatus configured to detect a mark including a plurality of mark elements which are formed on the original and the original holding unit, wherein the detection apparatus includes
- an image pickup unit configured to capture a two-dimensional image of the mark, and
- a processor which detects a position of the mark using the two-dimensional image of the mark obtained by the image pickup unit, and the processor
- sets a detection region in the two-dimensional image of the mark,
- generates a one-dimensional signal having a plurality of peaks by accumulating images included in the detection region,
- detects peaks in which differences between values of the peaks and a reference value are equal to or larger than a threshold value and peaks in which differences between values of the peaks and the reference value are smaller than the threshold value from among the plurality of peaks of the generated signal in order to determine if a failure region is present within the detection region, and
- in a case where a failure region is present within the detection region, the processor narrows the width of the detection region in the predetermined direction until the failure region is excluded so as to form a new detection region that does not include the failure region, generates a new one-dimensional integrated signal having a plurality of peaks by accumulating, in the predetermined direction, a two-dimensional image signal included in the new detection region, and detects a position of the mark based on the new one-dimensional integrated signal.

* * * * *